United States Patent
Tsay et al.

[11] Patent Number: 6,031,411
[45] Date of Patent: Feb. 29, 2000

[54] LOW POWER SUBSTRATE BIAS CIRCUIT

[75] Inventors: Ching-Yuh Tsay, Richardson; Hugh P. McAdams, McKinney; WahKit Loh, Richardson, all of Tex.

[73] Assignee: Texas Instruments Incorporated, Dallas, Tex.

[21] Appl. No.: 08/288,131

[22] Filed: Aug. 9, 1994

Related U.S. Application Data

[63] Continuation of application No. 08/083,427, Jun. 28, 1993, abandoned.

[51] Int. Cl.[7] .................................. G06F 1/04; H03K 5/13
[52] U.S. Cl. ............................................. 327/536; 327/534
[58] Field of Search ............................. 307/296.2, 296.8, 307/304, 296.7, 296.1; 365/226

[56] References Cited

U.S. PATENT DOCUMENTS

| | | | |
|---|---|---|---|
| 4,344,002 | 8/1982 | Chao | 307/304 |
| 4,430,581 | 2/1984 | Mogi et al. | 307/296 R |
| 4,438,346 | 3/1984 | Chuang et al. | 307/304 |
| 4,460,835 | 7/1984 | Masuoka | 307/304 |
| 4,686,386 | 4/1997 | Tadao | 327/544 |
| 4,961,162 | 10/1990 | Kumanoya et al. | 327/534 |
| 5,022,005 | 6/1991 | Tohnishi | 307/296.2 |
| 5,034,625 | 7/1991 | Min et al. | 307/296.2 |
| 5,065,091 | 11/1991 | Tobita | 324/158 R |
| 5,157,291 | 10/1992 | Shimoda | 307/296.2 |
| 5,208,557 | 5/1993 | Kersh, III | 307/296.2 |

FOREIGN PATENT DOCUMENTS

| | | | |
|---|---|---|---|
| 8905545 | 6/1989 | WIPO | 307/296.2 |

*Primary Examiner*—Dinh T. Le
*Attorney, Agent, or Firm*—Robert N. Rountree; Lawrence J. Bassuk; Richard L. Donaldson

[57] ABSTRACT

A plurality of substrate bias circuits (14, 16, and 18) are designed to provide a stable substrate reference potential for a variety of operating modes. Only one of the bias circuits is enabled by a control circuit (12) at any time for any operational mode. An on-demand boost bias circuit (16) is enabled whenever a level detector (20) indicates substrate bias has exceeded a predetermined limit during special operating modes such as burn-in or parallel test.

17 Claims, 2 Drawing Sheets

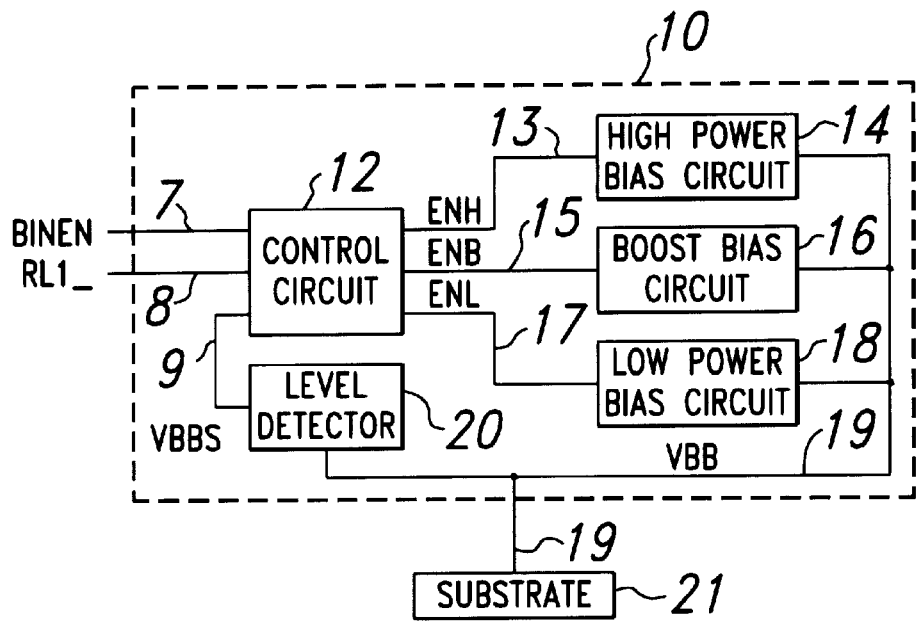
Fig. 1
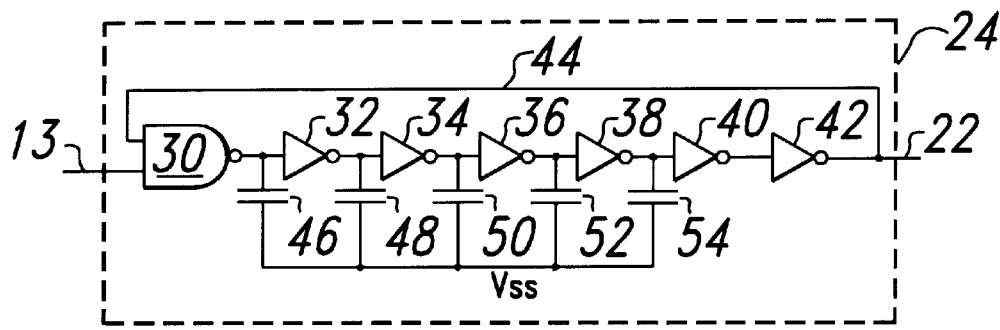
Fig. 2
Fig. 3

LOW POWER SUBSTRATE BIAS CIRCUIT

This application is a Continuation of application Ser. No. 08/083,427 filed Jun. 28, 1993 and now abandoned.

FIELD OF THE INVENTION

This invention relates to integrated circuits and more particularly to substrate bias circuits.

BACKGROUND OF THE INVENTION

Present complementary metal oxide semiconductor (CMOS) dynamic random access memory (DRAM) circuits are frequently used for main memory in a variety of applications including laptop and notebook computer systems which are battery powered. These battery powered applications impose practical limitations such as speed, power, and feature size on dynamic random access memory design. Optimal performance of a system depends on an effective balance of these factors in the design.

The trend in dynamic random access memory design is to minimize power consumption, as operating frequency increases, by the reduction of capacitance and operating voltage. Reduction of circuit feature sizes effectively reduces the length of leads, the surface area of diffusions, and the space between diffusions. Shorter lead lengths and smaller diffused areas advantageously reduce circuit capacitance. Less space between diffused regions, however, may have the undesirable effect of creating parasitic leakage paths between adjacent diffusions due to a phenomenon known as the short channel effect. This phenomenon results in a reduction in the threshold voltage of parasitic field effect transistors formed between closely spaced diffused regions and in an increase in leakage current. One method of increasing the isolation or threshold voltage of the parasitic field effect transistors is to increase the bulk or substrate impurity surface concentration. Such an increase in the substrate impurity surface concentration is limited by the consequent undesirable increase in junction capacitance.

On-chip substrate bias generators for dynamic random access memories have become a standard practice in the industry because they reduce junction capacitance between diffused regions and the substrate. Typically a negative bias with respect to ground is applied to a P-type substrate by the on-chip substrate bias generator. This negative substrate bias $V_{BB}$ increases the reverse bias of all junctions formed between N-type diffusions and the P-type substrate. Junction capacitance decreases because it is inversely proportional to the square root of the reverse bias across the junction. For a dynamic random access memory, bitline junction capacitance is a major component of active power consumption that must be charged and discharged during active operation. This active power consumption is determined by the product of capacitance, the square of the operating voltage, and the operating frequency. Thus, a significant reduction in active power consumption is achieved because bitline junction capacitance dominates the total circuit capacitance of the dynamic random access memory.

A reduction in leakage current or improved isolation between closely spaced diffused regions is achieved by the application of negative bias $V_{BB}$ to a P-type substrate with respect to ground or reference supply $V_{SS}$. The result of the negative bias is to increase the bulk to source potential of all N-channel transistors, including parasitic transistors, in common with the substrate. This increases the N-channel transistor threshold voltage by a phenomenon known as body effect, thereby decreasing leakage between the closely spaced diffused regions. Thus, the substrate bias $V_{BB}$ must be closely regulated over a variety of operating conditions, or large variations in speed and power of the dynamic random access memory will result from variations in N-channel transistor threshold voltage and junction capacitance.

Substrate bias regulation must comprehend large differences in substrate current during high-power active operation as well as low-power standby operation. In, U.S. Pat. No. 4,430,581, entitled SEMICONDUCTOR SUBSTRATE BIAS CIRCUIT, Jun-ichi Mogi et al use two substrate bias circuits. One of their bias circuits is always enabled and pumps substrate current at a constant frequency that is sufficient to compensate for junction leakage. The other bias circuit is enabled only during the active operation. It pumps substrate current at a frequency that is proportional to the dynamic random access memory operating frequency.

There are two notable issues with respect to the teaching of Mogi et al. First, the constant frequency bias circuit remains enabled when the variable frequency bias circuit is enabled. The variable frequency bias circuit is designed to operate in the dynamic random access memory active cycle and can pump much more current than the constant frequency bias circuit. Operating alone, the variable frequency bias circuit is sufficient to maintain a stable substrate bias level for current produced by both active operation and by junction leakage. Thus, the oscillator and pump circuit of the constant frequency bias circuit needlessly expend power during the active cycle. Second, the teaching of Mogi et al fails to satisfy some modes of operation which produce more substrate current than that which can be pumped by the active cycle bias circuit. Among these modes of operation are burn-in, where more substrate current is produced by high operating voltage, and parallel test, where more substrate current is produced by additional active arrays.

SUMMARY OF THE INVENTION

These issues are resolved by a circuit for generating a bias for a semiconductor device. A control circuit activates only one of a plurality of enable signals at any time. Each of a plurality of bias circuits is responsive directly to a different enable signal from the control circuit. At any time, only one of the bias circuits is enabled by an active enable signal from the control circuit. The enabled bias circuit controls the bias applied to a common bias terminal connected to the outputs of each of the bias circuits.

The present invention provides a stable substrate reference potential for a variety of operating modes. Power is conserved over previous methods by enabling only one bias circuit for any operational mode. A further improvement incorporates an on-demand bias circuit that is enabled whenever substrate bias exceeds predetermined limits during special operating modes such as burn-in or parallel test.

BRIEF DESCRIPTION OF THE DRAWINGS

A more complete understanding of the invention may be gained by reading the subsequent detailed description with reference to the drawings wherein:

FIG. 1 is block diagram of a substrate bias circuit;

FIG. 2 is a truth table relating to a control circuit included within FIG. 1;

FIG. 3 is an oscillator circuit which may be used in bias circuits of FIG. 1;

DETAILED DESCRIPTION OF THE PREFERRED EMBODIMENTS

Figure 4:
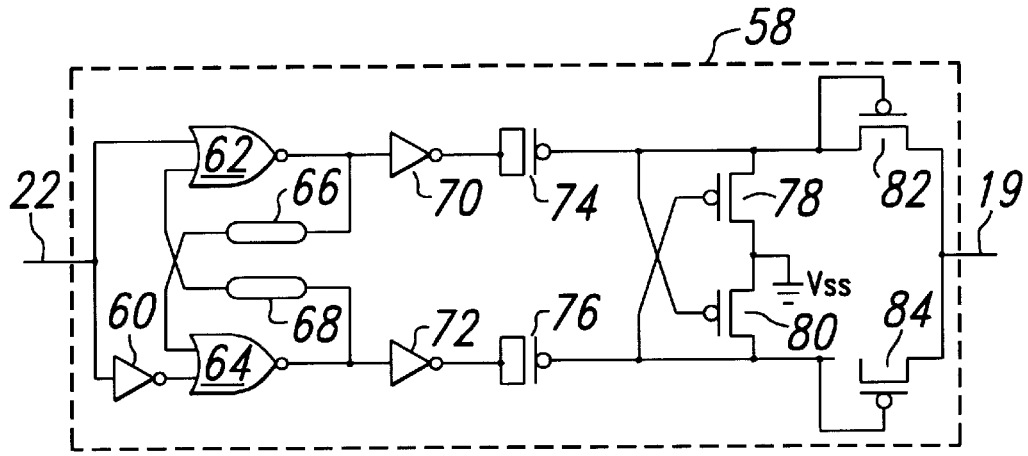
FIG. 4 is a pump circuit which may be used in bias circuits of FIG. 1.

Referring now to FIG. 1, the substrate bias circuit will be described in detail. Substrate bias circuit 10 has two input terminals 7 and 8 respectively, for receiving burn-in enable signal BINEN and row logic signal RL1_ and a common bias terminal 19. Common bias terminal 19 is connected to the substrate 21 of a semiconductor device. The burn-in enable signal BINEN is active to enable appropriate circuits during a burn-in operation. Row logic signal RL1_ is a clock signal that is derived from a row address strobe signal (RAS_) which has a repetition rate corresponding to the operating frequency of the dynamic random access memory. Shallow substrate bias signal VBBS is developed by level detector 20 and indicates the presence of a shallow substrate bias $V_{BB}$. The burn-in enable signal BINEN, row logic signal RL1_, and shallow substrate bias signal VBBS are inputs to control circuit 12. Generally, any combination of these inputs will cause control circuit 12 to activate only one of a number N of enable signals corresponding to the number N of bias circuits. Here, where the number N is equal to three, a combination of these inputs will cause only one of the following number N of enable signals: (a) enable high signal ENH, (b) enable boost signal ENB, or (c) enable low signal ENL to become active at a time. The enable signals, produced by control circuit 12, are applied to enable terminals 13, 15, and 17, respectively, of three substrate bias circuits 14, 16, and 18 so that only one of the three bias circuits is enabled at a time. The output terminal of each bias circuit 14, 16, and 18 is connected to the common bias terminal 19. The active, or enabled, bias circuit establishes a substrate bias $V_{BB}$ on substrate 21. All other bias circuits are in a high impedance state, and only the one active bias circuit establishes a substrate bias $V_{BB}$ at a time. Thus, an advantage of this invention is that power consumption is minimized since only one bias circuit is active at any time and other bias circuits remain inactive. Power consumption by oscillator or pump circuits in the inactive bias circuits is eliminated.

Common bias terminal 19 is also an input of level detector 20. Level detector 20 detects substrate bias $V_{BB}$ and activates shallow substrate bias signal VBBS when substrate bias $V_{BB}$ is shallow. Shallow substrate bias signal VBBS then activates enable boost signal ENB and disables enable high signal ENH and enable low signal ENL. Active enable boost signal ENB enables boost bias circuit 16 only until a sufficient substrate bias $V_{BB}$ is detected by level detector 20. Thus, an advantage of this invention is that any mode of operation that causes a shallow substrate bias $V_{BB}$ will activate only boost bias circuit 16 to restore substrate bias $V_{BB}$.

Referring now to FIG. 2, operational principles of the circuit illustrated by the block diagram of FIG. 1 will be described in detail with reference to a truth table for control circuit 12. Eight different operating conditions are represented on separate lines 1–8. Only three of them are discussed as examples to describe the table.

As shown in line 1 of the truth table, row logic signal RL1_ is active low during an active cycle and burn-in enable signal BINEN and shallow substrate bias signal VBBS are inactive low. Enable high signal ENH is active high and enable boost signal ENB and enable low signal ENL are inactive low. Thus, enable high signal ENH enables only high power bias circuit 14 to generate substrate bias $V_{BB}$ while other bias circuits are disabled.

A shallow substrate bias is only slightly negative (usually less than one volt) with respect to reference supply $V_{SS}$. Such a condition, as shown in line 2 of the truth table, will activate shallow substrate bias signal VBBS. Row logic signal RL1_ is active low and burn-in enable signal BINEN is inactive low. Enable boost signal ENB then becomes active high, and enable high signal ENH and enable low signal ENL are inactive low. Thus, enable boost signal ENB enables only boost bias circuit 16 to generate substrate bias $V_{BB}$ while other bias circuits are disabled.

In standby or precharge mode, as shown in line 3 of the truth table, row logic signal RL1_ is inactive high and burn-in enable signal BINEN and shallow substrate bias signal VBBS are inactive low. Enable low signal ENL is active high and enable high signal ENH and enable boost signal ENB are inactive low. Thus, enable low signal ENL will enable only low power bias circuit 18 to generate substrate bias while other bias circuits are disabled. Other control circuit input combinations operate in a similar manner such that only one bias enable signal is active high at any time for each line of the truth table.

Referring now to FIG. 3, there is shown an oscillator 24 which may be included in either of bias circuits 14, 16, or 18. For example, an oscillator 24 for bias circuit 14 has enable terminal 13 connected to one input of NAND gate 30. The output of NAND gate 30 is connected to a series of inverters to provide an odd number (7) of signal inversions between an input of NAND gate 30 and oscillator output terminal 22. This odd number of signal inversions provides the unstable condition necessary for oscillation. A high signal level at output terminal 22 is presented to an input of NAND gate 30 through feedback path 44. After seven gate delays, the signal at output terminal 22 goes low. After another seven gate delays, the signal at output terminal 22 goes high again. The output signal at terminal 22 continues to oscillate in this manner while the signal at enable terminal 13 is high. Capacitors 46, 48, 50, 52, and 54 are connected in a distributed manner between the inverter chain and reference supply $V_{SS}$. These capacitors may be connected to the reference supply $V_{SS}$, as described, or any reference supply, or they may be parasitic elements formed by the next gate input capacitance. Drive strengths of NAND gate 30 and inverters 32, 34, 36, 38, 40, and 42, together with capacitors 46, 48, 50, 52, and 54 determine the operating frequency of the oscillator 24.

Referring now to FIG. 4, a pump circuit 58 which may be included in either of bias circuits 14, 16, or 18 will be described in detail. For example, a pump circuit 58 for bias circuit 14 has input terminal 22 connected to the oscillator output terminal of FIG. 3. Except for inverter 60, the pump circuit comprises two symmetrical half pumps such that one half pump is in a pump cycle while the other half pump is in a precharge cycle. Inverter 60 provides a complementary input to NOR gate 64. Delay elements 66 and 68 control overlap during signal transitions at terminal 22. When the signal at input terminal 22 goes from high to low, NOR gate 64 output goes low. The output of inverter 72 turns P-channel precharge transistor 78 off by coupling its gate high through P-channel capacitor 76. No current is pumped back to common bias terminal 19 through P-channel diode 84 because it is reverse biased. After a short delay established by element 68, both inputs of NOR gate 62 go low resulting in a high output. This causes the output of inverter 70 to couple the gate of P-channel precharge transistor 80 low through P-channel capacitor 74, thereby initiating precharge of the gate of P-channel capacitor 76 to reference supply $V_{SS}$. This transition simultaneously transfers charge from the substrate connected to common bias terminal 19 through P-channel diode 82 to the gate of P-channel capacitor 74. A subsequent low to high transition of the signal at terminal 22 will repeat this sequence of events with roles of each half of the pump reversed. Thus, the gate of P-channel capacitor 74 will be precharged to reference supply $V_{SS}$, and more charge is transferred from the substrate connected to common bias terminal 19 through P-channel diode 84 to the gate of P-channel capacitor 76.

Figure 5:
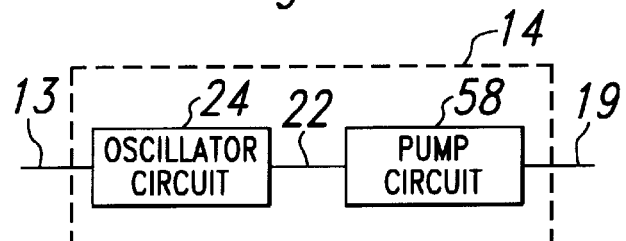
FIG. 5 is a block diagram of an embodiment of the high power bias circuit of FIG. 1.

Referring now to FIG. 5, an embodiment of either of bias circuits 14, 16, or 18 will be described in detail. Here, the bias circuit comprises the oscillator 24 of FIG. 3 and the pump circuit 58 of FIG. 4. In this embodiment, for example, oscillator circuit 24 output signal is connected to the input of pump circuit 58 at terminal 22. Thus, each cycle of the pump circuit 58 of high power bias circuit 14 corresponds to a cycle of oscillator circuit 24. Parametric values of components of the pump circuit are modified to pump the required quantity of charge corresponding to the frequency of oscillator circuit 24.

Figure 6:
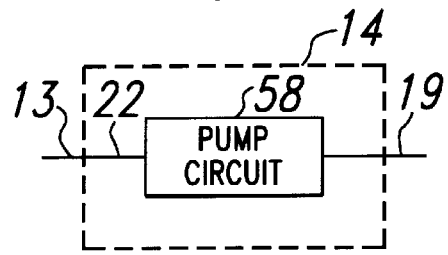
FIG. 6 is a block diagram of another embodiment of the high power bias circuit of FIG. 1.

Referring now to FIG. 6, another embodiment of either of bias circuits 14, 16, or 18 will be described in detail. Here, the bias circuit omits the oscillator 24 of FIG. 3 and includes only the pump circuit 58 of FIG. 4. In this embodiment, for example, high power bias circuit 14 has pump circuit input terminal 22 connected directly to terminal 13 from control circuit 12 of FIG. 1. Thus, each cycle of the pump circuit of high power bias circuit 14 corresponds to an active cycle of enable high signal ENH. Parametric values of components of the pump circuit are modified to pump the required quantity of charge corresponding to each active cycle of enable high signal ENH.

Figure 7:
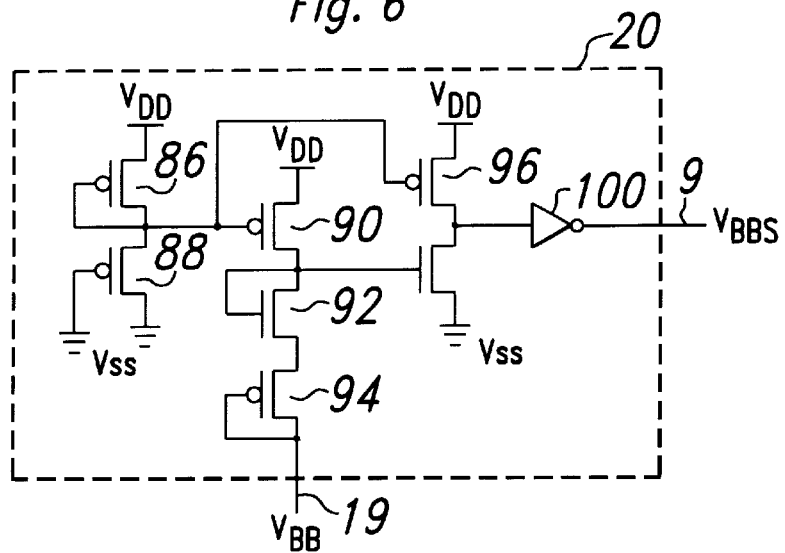
FIG. 7 is a level detector circuit which may be used in FIG. 1.

Referring now to FIG. 7, an example of level detector 20 will be described in detail. P-channel transistors 86 and 88 form a voltage divider to provide a bias at least one P-channel threshold voltage below positive supply $V_{DD}$ to the gates of P-channel transistors 90 and 96. P-channel transistors 90 and 96 are on since their sources are connected to positive supply $V_{DD}$. In normal operation, substrate bias $V_{BB}$ is more negative than one P-channel threshold voltage with respect to reference supply $V_{SS}$. The gate to source voltage of P-channel transistor 94 is about one P-channel threshold voltage, so the source voltage of P-channel transistor 94 is less than reference supply $V_{SS}$. The gate to source voltage of N-channel transistor 92 is about one N-channel threshold voltage, and the source of N-channel transistor 98 is connected to reference supply $V_{SS}$. Thus, the gate to source voltage of N-channel transistor 98 is less than an N-channel threshold voltage above reference supply $V_{SS}$, and it is turned off. P-channel transistor 96 is on and keeps the input of inverter 100 high and shallow substrate bias signal VBBS at terminal 9 remains low.

During parallel test mode, multiple arrays may be activated and peak substrate current may exceed the capacity of high power bias circuit 14. This may cause substrate bias $V_{BB}$ to rise within one P-channel threshold voltage of reference supply $V_{SS}$. The gate to source voltage of P-channel transistor 94 is about one P-channel threshold voltage, so the source of N-channel transistor 92 is more positive than reference supply $V_{SS}$. Since the gate to source voltage of N-channel transistor 92 is about one N-channel threshold voltage, the gate to source voltage of N-channel transistor 98 is greater than one N-channel threshold voltage and it is turned on. N-channel transistor 98 overrides P-channel transistor 96, the input of inverter 100 is pulled low, and shallow substrate bias signal VBBS at terminal 9 goes high. This causes control circuit 12 to activate only enable boost signal ENB. Enable high signal ENH and enable low signal ENL remain low. Enable boost signal ENB enables boost bias circuit 16, which transfers the additional charge necessary to restores a normal substrate bias $V_{BB}$.

Although the preferred embodiment of this invention describes the generation of a substrate bias $V_{BB}$ that is negative with respect to reference supply $V_{SS}$, it should be noted that the benefits of this invention may be achieved for a variety of applications. For example, referring now to FIG. 4, N-channel transistors might be substituted for P-channel transistors 74, 76, 78, 80, 82, and 84. Then, if the common terminal of N-channel precharge transistors 78 and 80 were connected to positive supply $V_{DD}$, this invention could produce a high voltage supply that is positive with respect to positive supply $V_{DD}$ for a capacitive load at common bias terminal 19. Additionally, the level detector of FIG. 7 could easily be modified to enable a boost bias circuit when the high voltage supply is less than one N-channel threshold voltage above positive supply $V_{DD}$.

Although the invention has been described in detail with reference to its preferred embodiment, it is to be understood that this description is by way of example only and is not to be construed in a limiting sense. It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit for generating a bias for a semiconductor device, the circuit comprising:

a control circuit, responsive to a plurality of input signals, for activating only one of N enable signals at any time, wherein N is greater than one;

a plurality of N bias circuits, each having an output terminal and an enable terminal, the enable terminal receiving one of the enable signals to enable only one of the bias circuits at any time for transferring charge between the output terminal and a first reference supply, thereby generating the bias at the output terminal;

a common bias terminal connected to the output terminal of each of the bias circuits; and a detector circuit, responsive to the bias of the common bias terminal, for providing one input signal to the control circuit for enabling one of the bias circuits.

2. The circuit of claim 1 wherein at least one of the bias circuits comprises an oscillator circuit and a pump circuit, the oscillator circuit being responsive to one of the enable signals.

3. The circuit of claim 2 wherein the common bias terminal is a substrate terminal of the semiconductor device.

4. The circuit of claim 2 wherein the common bias terminal is a second reference supply terminal of the semiconductor device.

5. A method of generating a bias for a semiconductor device, including the steps of:

activating only one of N enable signals at any time in response to a plurality of input signals, wherein N is greater than one;

enabling only one of N bias circuits at any time in response to the one of N enable signals for transferring charge between a common bias terminal and a first reference supply wherein a detector circuit, responsive to the potential of the common bias terminal, provides one input signal to a control circuit for enabling one of the bias circuits; and generating the bias at the common bias terminal by the transferring charge.

6. The method of claim 5 wherein at least one of the bias circuits comprises an oscillator circuit and a pump circuit, the oscillator circuit being responsive to one of the enable signals.

7. The method of claim 6 wherein the common bias terminal is a substrate terminal of the semiconductor device.

8. The method of claim 6 wherein the common bias terminal is a second reference supply terminal of the semconductor device.

9. A circuit for generating a bias for a semiconductor device, the circuit comprising:

a control circuit, responsive to a plurality of input signals, for activating only one of N enable signals at any time, wherein N is greater than one;

a plurality of N bias circuits, each having an output terminal and an enable terminal, the enable terminal receiving one of the enable signals to enable only one of the bias circuits at any time for transferring charge between the output terminal and a first reference supply, thereby generating the bias at the output terminal; and a common bias terminal connected to the output terminal of each of the bias circuits wherein the common bias terminal is a second reference supply terminal of the semiconductor device and wherein the bias at the second reference supply terminal is a high voltage.

10. A method of generating a bias for a semiconductor device, including the steps of:

activating only one of N enable signals at any time in response to a plurality of input signals, wherein N is greater than one;

enabling only one of N bias circuits at any time in response to the one of N enable signals for transferring charge between a common bias terminal and a first reference supply; and generating the bias at the common bias terminal by the transferring charge wherein the common bias terminal is a second reference supply terminal of the semiconductor device and wherein the bias at the second reference supply terminal is a high voltage.

11. A circuit for generating a bias for a semiconductor device, the circuit comprising:

a common bias terminal;

a plurality of bias circuits, each having an output terminal coupled to the common bias terminal and having an input terminal;

a detector circuit, responsive to the bias at the common bias terminal, for producing a first output signal; and a control circuit having a plurality of output terminals, each output terminal being coupled to one input terminal of at least one bias circuit for enabling the at least one bias circuit, and having a first input terminal for receiving the first output signal, a second input terminal for receiving a first input signal corresponding to a first mode of operation of the semiconductor device and a third input terminal for receiving a second input signal corresponding to a second mode of operation of the semiconductor device.

12. A circuit as in claim 11 wherein the first mode of operation of the semiconductor device is an active cycle.

13. A circuit as in claim 12 wherein the second mode of operation of the semiconductor device is a burn-in mode.

14. A circuit as in claim 12 wherein the second mode of operation of the semiconductor device is a high voltage mode.

15. A circuit as in claim 12 wherein the second mode of operation of the semiconductor device is a parallel test mode.

16. The circuit of claim 12 wherein the bias is a substrate voltage.

17. The circuit of claim 12 wherein the bias is a high voltage.

* * * * *